United States Patent
Vaed et al.

(10) Patent No.: US 7,622,357 B2
(45) Date of Patent: Nov. 24, 2009

(54) SEMICONDUCTOR DEVICE STRUCTURES WITH BACKSIDE CONTACTS FOR IMPROVED HEAT DISSIPATION AND REDUCED PARASITIC RESISTANCE

(75) Inventors: Kunal Vaed, Poughkeepsie, NY (US); Jae-Sung Rieh, Fishkill, NY (US); Richard P. Volant, New Fairfield, CT (US); Francois Pagette, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 161 days.

(21) Appl. No.: 11/420,282

(22) Filed: May 25, 2006

(65) Prior Publication Data
US 2007/0275533 A1    Nov. 29, 2007

(51) Int. Cl.
*H01L 21/331* (2006.01)
(52) U.S. Cl. .................. 438/309; 438/336; 438/337; 257/E27.053
(58) Field of Classification Search ......... 438/309–377; 257/E27.053
See application file for complete search history.

(56) References Cited

U.S. PATENT DOCUMENTS

| | | | |
|---|---|---|---|
| 3,956,033 A | 5/1976 | Roberson | |
| 4,292,730 A | 10/1981 | Ports | |
| 4,870,475 A | 9/1989 | Endo et al. | |
| 5,164,326 A | 11/1992 | Foerstner et al. | |
| 5,273,915 A | 12/1993 | Hwang et al. | |
| 5,362,659 A | 11/1994 | Cartagena | |
| 5,406,113 A | 4/1995 | Horie | |
| 5,643,821 A | 7/1997 | Beasom | |
| 5,739,062 A * | 4/1998 | Yoshida et al. | 438/320 |
| 5,895,953 A | 4/1999 | Beasom | |
| 5,952,694 A | 9/1999 | Miyawaki et al. | |
| 6,329,265 B1 | 12/2001 | Miyawaki et al. | |
| 6,414,371 B1 * | 7/2002 | Freeman et al. | 257/584 |
| 2003/0003724 A1 * | 1/2003 | Uchiyama et al. | 438/667 |
| 2003/0122128 A1 * | 7/2003 | Coolbaugh et al. | 257/63 |
| 2005/0161769 A1 | 7/2005 | Coolbaugh et al. | |
| 2005/0181569 A1 * | 8/2005 | Koshimizu et al. | 438/312 |

* cited by examiner

*Primary Examiner*—H. Jey Tsai
(74) *Attorney, Agent, or Firm*—Scully, Scott, Murphy & Presser, P.C.; H. Daniel Schnurmann

(57) ABSTRACT

The present invention relates to a device structure that comprises a substrate with front and back surfaces, and at least one semiconductor device with a first conductive structure located in the substrate and a second conductive structure located thereover. A first conductive contact is located over the front surface of the substrate and laterally offset from the first conductive structure. The first conductive contact is electrically connected to the first conductive structure by a conductive path that extends: (1) from the first conductive structure through the substrate to the back surface, (2) across the back surface, and (3) from the back surface through the substrate to the first conductive contact on the front surface. Further, a second conductive contact is located over the front surface and is electrically connected to the second conductive structure. The conductive path can be formed by lithography and etching followed by metal deposition.

6 Claims, 9 Drawing Sheets

SEMICONDUCTOR DEVICE STRUCTURES WITH BACKSIDE CONTACTS FOR IMPROVED HEAT DISSIPATION AND REDUCED PARASITIC RESISTANCE

FIELD OF THE INVENTION

The present invention generally relates to semiconductor device structures. More specifically, the present invention relates to a bipolar device structure having backside contacts for improved heat dissipation and reduced parasitic resistance.

BACKGROUND OF THE INVENTION

Bipolar junction transistors (BJTs) and varactors, have played an increasingly significant role in the semiconductor industry. The improvement of bipolar circuit performance, especially the operation speed, is an essential requirement for improving network communication systems and wireless systems. BJTs with silicon-germanium bases provide the desired device performance in such systems. For example, SiGe-based heterojunction bipolar transistors (HBTs) have recently achieved a current cut-off frequency ($f_t$) of about 350 GHz.

As current density increases in the bipolar circuits, heat dissipation and parasitic resistance of the bipolar devices begin to impose more significant limitations on the device performance. High junction temperature and collector resistance degrade $f_t$, and the maximum oscillation frequency ($f_{max}$) is in turn limited by $f_t$ as well as by the effective resistance-capacitance (RC) time constant.

Conventionally, the collector of the BJT or the n-type cathode of the varactor is contacted by a buried semiconductor layer (also referred to as sub-collector in a bipolar junction transistor) that is located in the semiconductor substrate underneath the collector of the BJT or the cathode of the varactor. Such a buried semiconductor layer extends laterally to a reach-through contact, which then extends vertically to a front surface of the semiconductor substrate and forms electrical connection with a metal contact that is located over the front surface of the substrate and is laterally offset from the collector of the BJT or the cathode of the varactor.

FIG. 1 shows a conventional heterojunction bipolar transistor (HBT), which comprises a collector 15, an intrinsic base 20, an extrinsic base 25, and an emitter 35 that is isolated from the extrinsic base by dielectric 30. Metal via contact 50 and electrode 55, which are located over a front surface of the semiconductor wafer 1 and are laterally aligned with the extrinsic base 25, directly form an electrical connection with the extrinsic base 25 of the HBT. Similarly, metal via contact 40 and electrode 60, which are located over a front surface of the semiconductor wafer 1 and are laterally aligned with the emitter 35, directly form an electrical connection with the emitter 35 of the HBT.

However, metal via contact 45 and electrode 65, which are located over a front surface of the semiconductor wafer 1, are laterally offset from the collector 15, and electrical connection therefore cannot be directly formed between the collector 15, the metal via contact 45 and the electrode 65.

In contrast, the collector 15 is first contacted by a buried semiconductor (or sub-collector) layer 18 located in the semiconductor wafer 1, which in turn contacts a reach-through implant region 43 that is isolated from the collector 15 by one or more shallow trench isolation regions 10 in the semiconductor wafer 1. The buried semiconductor layer 18 provides a horizontal conductive path from beneath the active region of the HBT to the reach-through implant region 43, while the reach-through implant region 43 provides a vertical conductive path from the buried semiconductor layer 18 to the metal via contact 45 as well as the electrode 65 on the front surface of the semiconductor wafer 1. Deep trench isolation 5 and shallow trench isolation 10 are also formed in the semiconductor wafer 1 to isolate the HBT transistor from adjacent devices. Specifically, the reach-through implant region 43 is defined by the surrounding shallow trench isolation 10.

Typically, the buried semiconductor layer 18 is first formed in the semiconductor substrate 1 by high-dose ion implantation followed by high temperature annealing and epitaxial deposition of a semiconductor device layer (not shown) thereon. Deep trench isolation regions 5 and shallow trench isolation regions 10 are then formed. Specifically, the deep trench isolation regions 5 extend through the semiconductor device layer (not shown) and the buried semiconductor layer 18 into the substrate 1, and the shallow trench isolation regions 10 extend only through the semiconductor device layer (not shown) and stop at the buried semiconductor layer 18. The shallow trench isolation regions 10 function to pattern the semiconductor device layer (not shown) and thereby define a device or collector region 15 and a reach-through contact region 43 therein. The reach-through contact region 43 is adjacent to, but is at the same time isolated from, the device or collector region 15 by one or more shallow trench isolation regions 10. Subsequently, dopant implantation and annealing are carried out in the reach-through contact region 43 to form a reach-through contact. The active components of the bipolar device are then formed over the device or collector region of the semiconductor device layer (not shown), followed by deposition of an interlevel dielectric (ILD) layer (not shown) over the entire structure and formation of metal via contacts 40, 45, and 50 through the ILD layer (not shown) to the front surface of the substrate 1 to provide electrical connections to various active components of the bipolar device, such as the collector 15, the base 25, and the emitter 35 of the HBT as shown in FIG. 1 or the cathode and anode of a varactor (not shown).

The high current density typically used in modern semiconductor circuitry generates substantial junction heat, which can only be dissipated into the bulk semiconductor substrate through the buried semiconductor layer. Since semiconductor materials are not ideal heat conductors, un-dissipated junction heat in turn causes significant increase in the junction temperature.

Further, the parasitic resistance of a bipolar device is composed of three major components: (1) the resistance of a vertical conductive path from the collector-base junction of a BJT (or the cathode-anode junction of a varactor) to the buried semiconductor layer, (2) the resistance of a horizontal conductive path along the buried semiconductor layer, and (3) the resistance of another vertical path from the buried semiconductor layer through the reach-through implant region to the metal contact located on the front surface of the substrate. Because semiconductor materials, which form the above-mentioned conductive paths in the conventional bipolar device, have relatively high resistance, the overall parasitic resistance in the conventional bipolar device is significant, which imposes limitation on the maximum oscillation frequency ($f_{max}$) of the bipolar device as the cut-off frequency ($f_t$) of the device increases.

There is therefore a need to improve heat dissipation and reduce parasitic resistance in bipolar devices for enhancing the radio-frequency (RF) performance of such bipolar devices.

SUMMARY OF THE INVENTION

The present invention solves the above-described problems of conventional bipolar devices by providing backside metal contacts to improve dissipation of the junction heat, reduce junction temperature, and reduce parasitic resistance. The conventional buried semiconductor and reach-through implanted region as well as their associated resistance load can therefore be eliminated. The backside metal contacts function as a heat sink for dissipating the junction heat and reducing the junction temperature, which along with the reduced parasitic resistance provide for improved electrical performance of the bipolar device.

In one aspect, the present invention relates to a device structure that comprises:

- a substrate having front and back surfaces;
- at least one semiconductor device comprising at least a first conductive structure located in the substrate and a second conductive structure located thereover,
- a first conductive contact located over the front surface of the substrate and laterally offset from the first conductive structure, wherein the first conductive contact is electrically connected to the first conductive structure by a conductive path that extends: (1) from the first conductive structure through the substrate to the back surface thereof, (2) across the back surface of the substrate, and (3) from the back surface through the substrate to the first conductive contact on the front surface; and
- a second conductive contacts located over the front surface of the substrate and electrically connected to the second conductive structure.

The term "laterally offset" as used herein refers to an offset relationship between two structures along a direction that is parallel to a substrate surface. No overlap is present between such laterally offset structures along the direction that is parallel to the substrate surface.

In a preferred, but not necessary, embodiment of the present invention, the substrate comprises a semiconductor-on-insulator (SOI) substrate having a base semiconductor substrate layer, a buried insulator layer located over the base semiconductor substrate layer, and a semiconductor device layer located over the buried insulator layer. An upper surface of the semiconductor device layer defines the front surface of the substrate, and a lower surface of the base semiconductor substrate layer defines a back surface of the substrate.

The semiconductor device of the present invention is preferably a bipolar semiconductor device. Specifically, the first conductive structure of such a bipolar semiconductor device has a first conductivity type, and the second conductive structure has a second, opposite conductivity type.

In a specific embodiment of the present invention, the semiconductor device comprises a bipolar junction transistor (BJT). The BJT preferably comprises a collector that is located in the substrate and a base that is located over the collector. A base metal contact located over the front surface of the substrate is electrically connected to the base. A collector metal contact, which is located over the front surface of the substrate and is laterally offset from the collector, is electrically connected to the collector by a metal line that extends: (1) from the collector through the substrate to the back surface of the substrate, (2) across the back surface of the substrate, and (3) from the back surface of the substrate through the substrate to the collector metal contact on the front surface of the substrate. The BJT may further comprise an emitter located over the base, with an emitter metal contact that is located over the front surface of the substrate and is electrically connected to the emitter.

In another embodiment of the present invention, the semiconductor device comprises a varactor that preferably comprises a cathode that is located in the substrate and an anode that is located over the cathode. An anode metal contact located over the front surface of the substrate is electrically connected to the anode. A cathode metal contact, which is located over the front surface of the substrate and is laterally offset from the cathode, is electrically connected to the cathode by a metal line that extends: (1) from the cathode through the substrate to the back surface of the substrate, (2) across the back surface of the substrate, and (3) from the back surface of the substrate through the substrate to the cathode metal contact on the front surface of the substrate. More preferably, dopant profiles of the cathode and anode are adjusted to create a hyper-abrupt junction varactor (HJV).

In another aspect, the present invention relates to a method for forming a device structure that comprises:

- forming a precursor structure that comprises: (a) a substrate that has a front surface and a back surface, (b) at least one semiconductor device that comprises at least a first conductive structure located in the substrate and a second conductive structure located over the first conductive structure, (c) a first conductive contact located over the front surface of the substrate that is laterally offset from, and not electrically connected to, the first conductive structure, and (d) a second conductive contact located over the front surface of the substrate that is electrically connected to the second conductive structure; and
- forming a conductive path in said precursor structure to electrically connect the first conductive structure with the first conductive contact, wherein the conductive path extends: (1) from the first conductive structure through the substrate to the back surface of the substrate, (2) across the back surface of the substrate, and (3) from the back surface of the substrate through the substrate to the first conductive contact on the front surface of the substrate.

Preferably, but not necessarily, the conductive path is formed by:

- patterning the substrate to form first and second openings therein, wherein the first opening is laterally aligned with the first conductive structure and extends from the first conductive structure through the substrate to the back surface of the substrate, and wherein the second opening is laterally aligned with the first conductive contact and extends from the back surface of the substrate through the substrate to the first conductive contact on the front surface of the substrate;
- depositing a metal in the first and second openings and over the back surface of the substrate; and
- patterning the deposited metal to thereby form a metal line that extends: (1) from the first conductive substrate through the substrate to the back surface of the substrate; (2) across the back surface of the substrate, and (3) from the back surface of the substrate through the substrate to the first conductive contact on the front surface of the substrate.

Preferably, but not necessarily, the substrate is patterned by lithography and etching.

Other aspects, features and advantages of the invention will be more fully apparent from the ensuing disclosure and appended claims.

DETAILED DESCRIPTIONS OF THE INVENTION, AND PREFERRED EMBODIMENTS THEREOF

Figure 1:
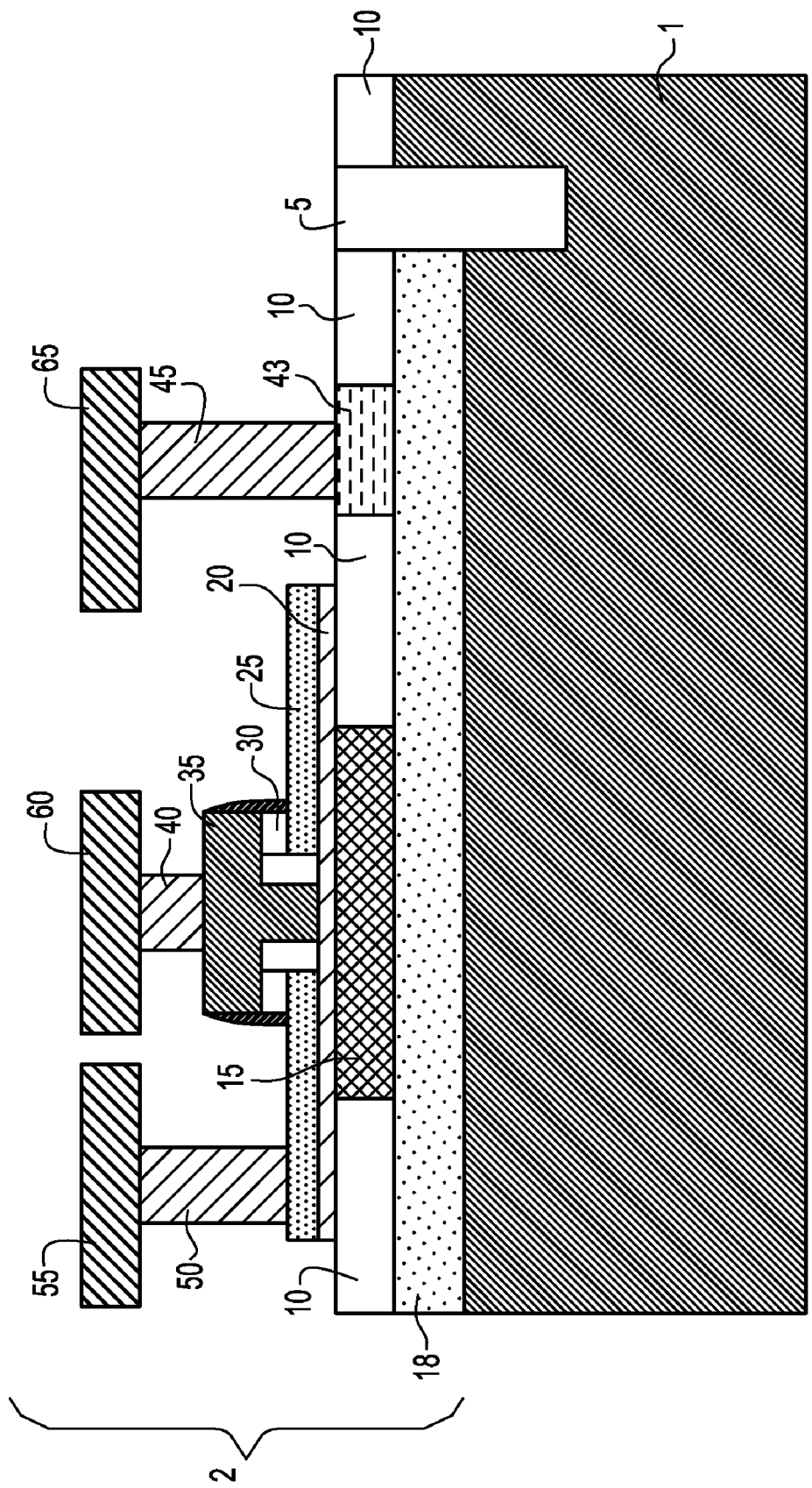
FIG. 1 shows a cross-sectional view of a conventional heterojunction bipolar transistor (HBT), which contains a buried semiconductor or sub-collector layer and a reach-through implant region for electrically connecting a collector with a collector metal contact that is located on the front surface of the substrate but is laterally offset from the collector.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The present invention provides improved bipolar devices with backside metal contacts for improving dissipation of junction heat, reducing junction temperature, and reducing parasitic resistance in the bipolar devices. The use of such backside metal contacts allows complete elimination of the buried semiconductor and reach-through implanted region employed in the conventional bipolar semiconductor devices and thereby eliminates their respective resistance loads. Correspondingly, the device performance of the bipolar devices can be improved significantly.

The improved bipolar devices of the present invention preferably each comprise a first conductive structure of a first conductivity type and a second conductive structure of a second, opposite conductivity type. The first conductive structure is located in a semiconductor substrate, while the second conductive structure is located over the first conductive structure.

A first conductive contact is provided over the front surface of the substrate, and the first conductive contact is arranged in a laterally offset relationship with respect to the first conductive structure, i.e., the first conductive contact is offset from the first conductive structure along a direction that is parallel to the substrate surface, with no overlap along such a direction. A conductive path, preferably a metal line, is arranged and constructed to electrically connect the first conductive contact with the first conductive structure. Such a conductive path specifically contains at least three portions, the first of which extends from the first conductive structure through the substrate to the back surface of the substrate, the second of which extends across the back surface of the substrate, and the third of which extends from the back surface through the substrate to the first conductive contact on the front surface of the substrate.

A second conductive contact is also provided over the front surface of the substrate, but the second conductive contact is arranged in a laterally aligned relationship with respect to the second conductive structure, i.e., the second conductive contact is aligned with at least a portion of the second conductive structure along the direction that is parallel to the substrate surface. In this manner, the second conductive contact is electrically connected to the second conductive structure in a direct manner, and no additional conductive path is necessary for connecting the second conductive contact and the second conductive structure.

Figure 2:
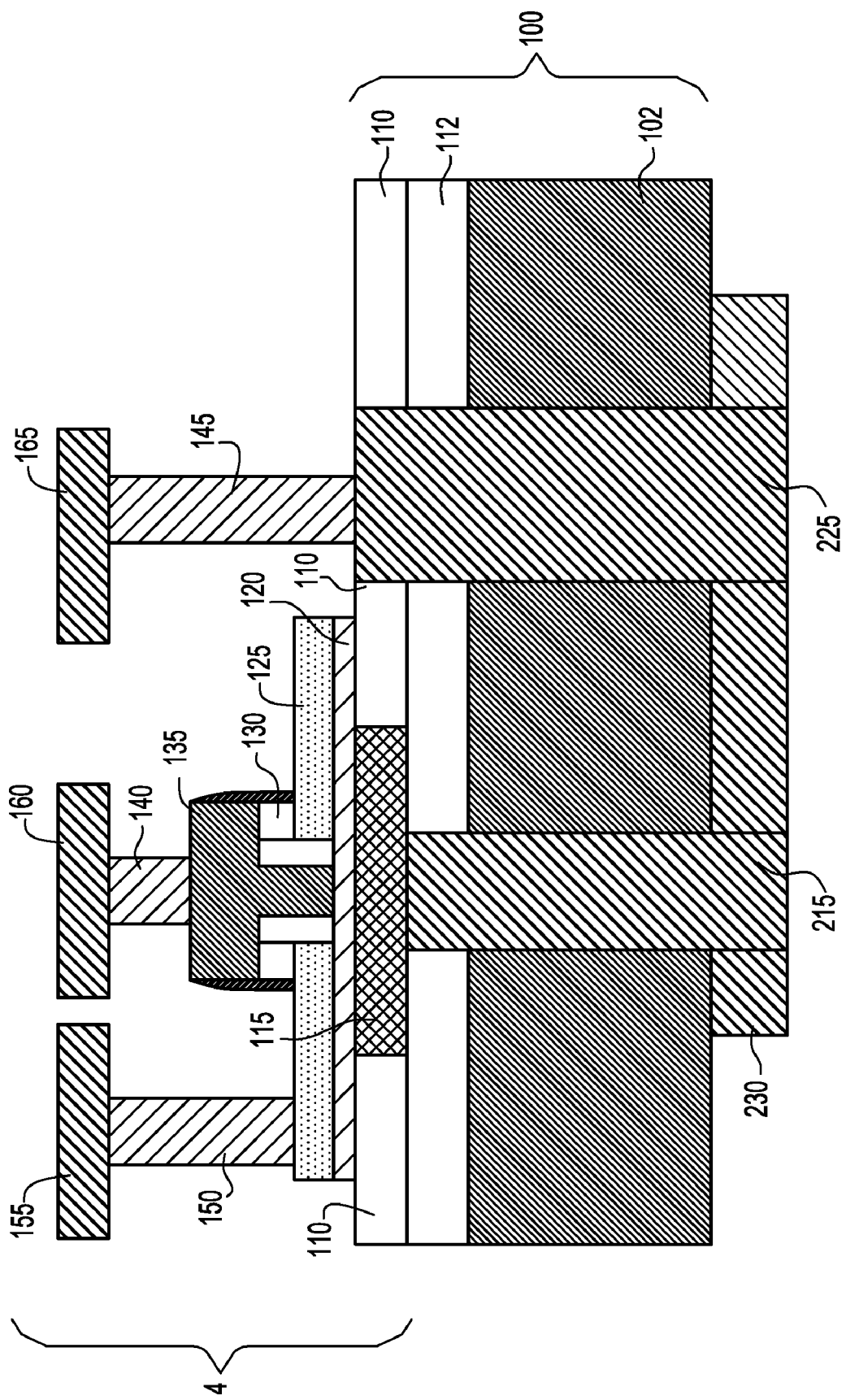
FIG. 2 shows a cross-sectional view of an exemplary HBT that contains backside metal contacts for electrically connecting a collector with a collector metal contact that is located on the front surface of the substrate but is laterally offset from the collector, according to one embodiment of the present invention.

FIG. 2 shows a cross-sectional view of an exemplary HBT that contains backside metal contacts for electrically connecting a collector with a collector metal contact that is located on the front surface of the substrate but is laterally offset from the collector, according to one embodiment of the present invention.

Specifically, the HBT 4 is fabricated over a substrate structure 100 that preferably has a semiconductor-on-insulator (SOI) configuration and includes a base semiconductor substrate layer 102, a buried insulator layer 112, and a semiconductor device layer (not shown) that has been patterned by isolation regions 110 into at least one active device region 115.

The base semiconductor substrate layer 102 and the semiconductor device layer (not shown) may comprise any semiconductor material including, but not limited to: Si, SiC, SiGe, SiGeC, Ge alloys, GaAs, InAs, InP, other III-V or II-VI compound semiconductors, or organic semiconductor structures. In some embodiments of the present invention, it is preferred that the base semiconductor substrate layer 102 and the semiconductor device layer (not shown) be composed of a Si-containing semiconductor material, i.e., a semiconductor material that includes silicon. The base semiconductor substrate layer 102 may be doped, undoped, or contain both doped and undoped regions therein (not shown).

The buried insulator layer 112 may comprise any suitable insulator material(s), and it typically comprises an oxide, a nitride, or an oxynitride in either a crystalline phase or a non-crystalline phase. The physical thickness of the buried insulator 112 may range from about 10 nm to about 1000 nm, and more preferably from about 20 nm to about 500 nm.

The SOI substrate structure 100, as shown in FIG. 2, can be formed in situ by depositing the buried insulator layer 112 over the base semiconductor substrate layer 102 via chemical vapor deposition, thermal oxidation or a combination thereof, followed by deposition of the semiconductor device layer (not shown) and formation of the shallow trench isolations 110. Alternatively, the SOI substrate structure 100 can be formed in situ by a silicon implanted oxide (SIMOX) process, during which oxygen ions are implanted into a bulk semiconductor substrate at a predetermined depth, followed by high temperature anneal to effectuate reaction between the semiconductor material and the implanted oxygen ions, thereby forming a buried oxide layer in the semiconductor substrate at the predetermined depth. Further, the SOI substrate structure 100 may be fabricated from pre-formed insulator and semiconductor layers by wafer-bonding techniques.

The isolation regions 110 may be either trench isolation regions or field oxide isolation regions. The trench isolation regions are formed utilizing a conventional trench isolation process well known to those skilled in the art. For example, lithography, etching and filling of the trenches with a trench dielectric may be used in forming the trench isolation regions. Optionally, a liner may be formed in the trenches prior to trench fill, and a densification step may be performed after the trench fill and a planarization process may follow the trench fill as well. The field oxide regions may be formed utilizing a so-called local oxidation of silicon process.

The HBT contains a collector that is located in the substrate structure at the active device region 115, an intrinsic base 120 that is located over an upper surface of the substrate 100 and atop the collector 115, an extrinsic base 125 that is located over the intrinsic base 120, and a T-shaped emitter 135 that is located over the extrinsic base 125. The T-shaped emitted 135 is in direct contact with the intrinsic base 120, but it is electrically isolated from the extrinsic base 125 by insulator spacers 130.

Preferably, but not necessarily, the intrinsic base 120 comprises silicon germanium, and it covers the entire collector 115 and portions of the trench isolation regions 110. The SiGe intrinsic base 120 may be formed by any suitable method well known in the art. After formation of the SiGe intrinsic base 120, the extrinsic base 125 that is preferably comprised of polysilicon, the insulator spacers 130, and the T-shaped emitter 135 that is also preferably comprised of polysilicon can be formed. Specifically, the polysilicon emitter 135 extends through the polysilicon extrinsic base 125 and directly contacts the SiGe intrinsic base 120, but the emitter 135 is electrically isolated from the extrinsic base 125 on each side by the insulator spacers 130. In a preferred, but not necessary, embodiment of the present invention, the base semiconductor substrate layer 102 comprises lightly p-doped silicon, the semiconductor device layer (not shown) is doped with an n-type dopant species, and the extrinsic base 125 is doped with a p-type dopant species.

After formation of the polysilicon extrinsic base 125, the insulator spacers 130, and the polysilicon emitter 135, an interlevel dielectric (ILD) layer (not shown) is deposited over the entire structure. The ILD layer may be deposited by any suitable methods, such as chemical vapor deposition (CVD), and it may comprise any suitable interlevel dielectric materials, which include, but are not limited to: silicon dioxide, such as an oxide deposited from a tetraethylorthosilicate (TEOS) precursor, borophosphosilicate glass (BPSG), or undoped silicate glass (USG).

Once the ILD layer (not shown) is deposited, metal via contacts 140, 145, and 150 can be formed through the ILD layer (not shown) over the front surface of the substrate structure 100 by conventional lithography and etching processes. On one hand, the metal via contacts 140 and 150 are laterally aligned with the emitter 135 and the extrinsic base 125, and they provide direct electrical connection between emitter electrode 160, base electrode 155, which are located over the ILD layer (not shown), the emitter 135, and the extrinsic base 125, as shown in FIG. 2. On the other hand, the metal via contact 145 is laterally offset from the collector 115 and therefore cannot provide direct electrical connection between collector electrode 165 and the collector 115. Instead, a conductive path, which preferably comprises a first metal via 215 that extends from the collector 115 through the buried insulator layer 112 and the base semiconductor substrate layer 102 to the backside of the substrate structure 100, a metal line 230 that extends across the backside surface of the substrate structure 100, and a second metal via 225 that extends from the backside surface of the substrate structure 100 to contact the metal via contact 145 on the front surface of the substrate 100, is provided to electrically connect the collector 115 with the collector electrode 165.

The backside metal contacts 215, 225 and 230 as shown in FIG. 2 conjunctively act as a heat sink for reducing the junction temperature in the HBT device 4. They also function to reduce the parasitic resistance in the HBT device 4, thereby improving the device performance of such a device.

The HBT device as shown in FIG. 2 can be readily fabricated by exemplary processing steps that are illustrated in greater details hereinafter with reference to FIGS. 3-9.

Figure 3:
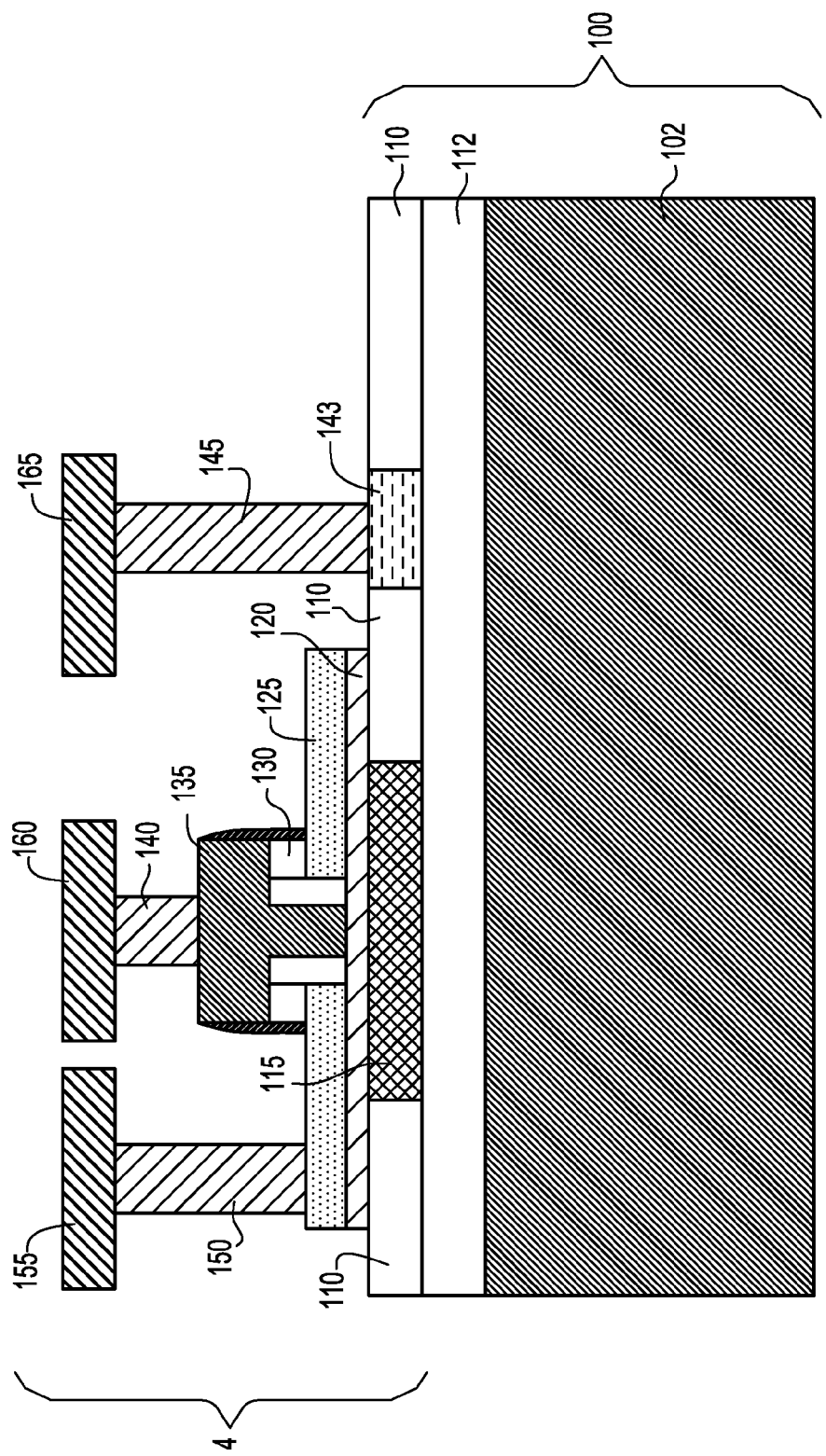
FIGS. 3-8 show exemplary processing steps for forming the HBT device of FIG. 2 by using lithography and etching, according to one embodiment of the present invention.

First, a precursor structure containing the HBT 4 with metal via contacts 140, 145, and 150 and electrodes 160, 165, and 155 already formed over the front surface of the substrate 100 is provided, as shown in FIG. 3. As mentioned hereinabove, the laterally aligned metal via contacts 140 and 150 provide direct electrical connection between the emitter 135, the emitter electrode 160, the extrinsic base 125, and the base electrode 155. However, no electrical connection is established yet between the collector 115 and the collector electrode 165, due to the lateral offset relationship between the collector 115 and the metal via contact 145. Optionally, a reach-through implant region 143, which is similar to that typically employed in the conventional HBT 2 of FIG. 1, is located in the substrate 100 and is in contact with the metal via contact 145.

Figure 4:
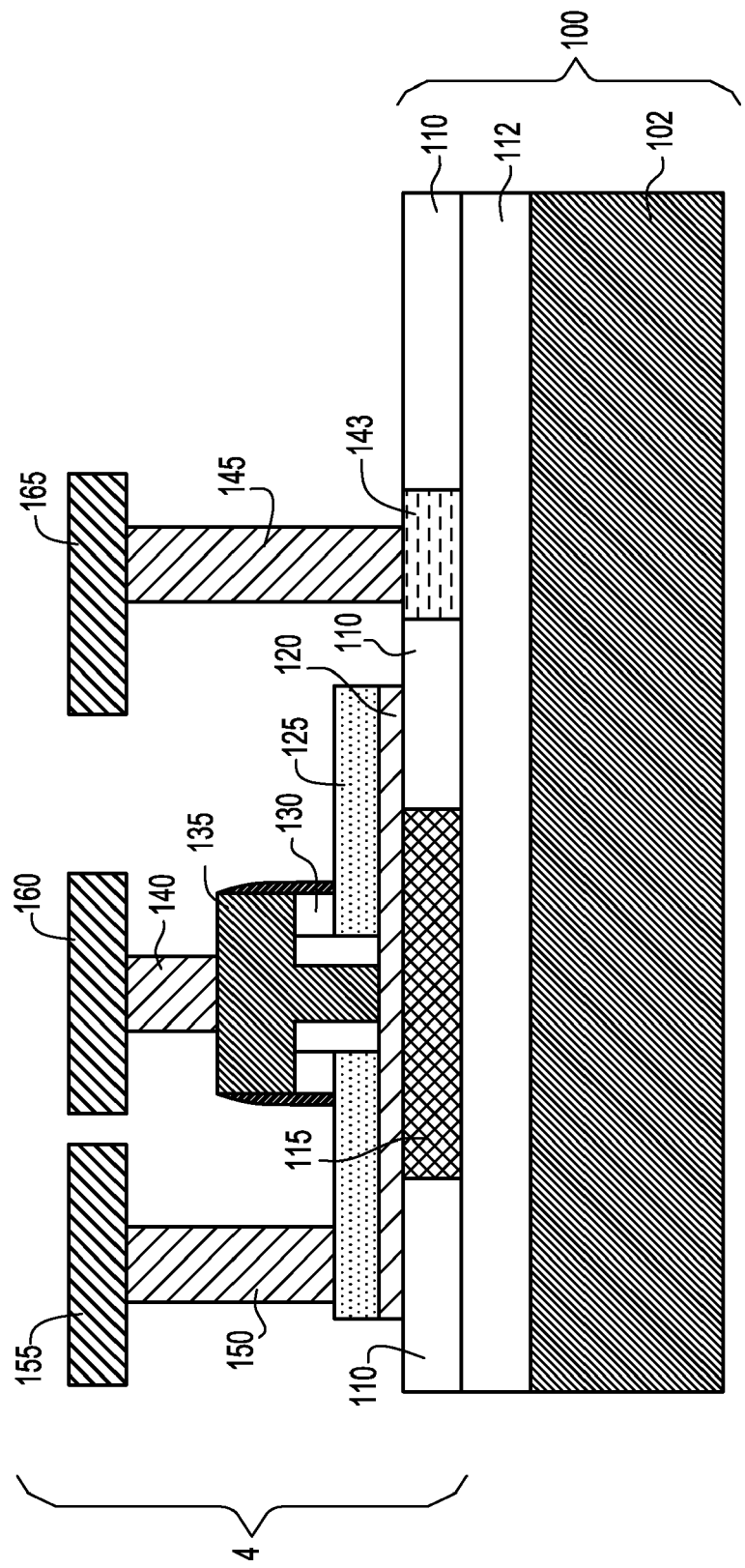

Next, the substrate 100 is turned upside down and the backside of the base semiconductor substrate layer 102 is optionally thinned from about 500-1000 μm (preferably 600-800 μm) down to about 50-300 μm (preferably 100-200 μm), as shown in FIG. 4. The thinning of the base semiconductor substrate layer 102 can be readily carried out by any suitable wafer thinning technique well known in the art, including, but not limited to: chemical mechanical polishing, wet etching, grinding, etc.

Figure 5:
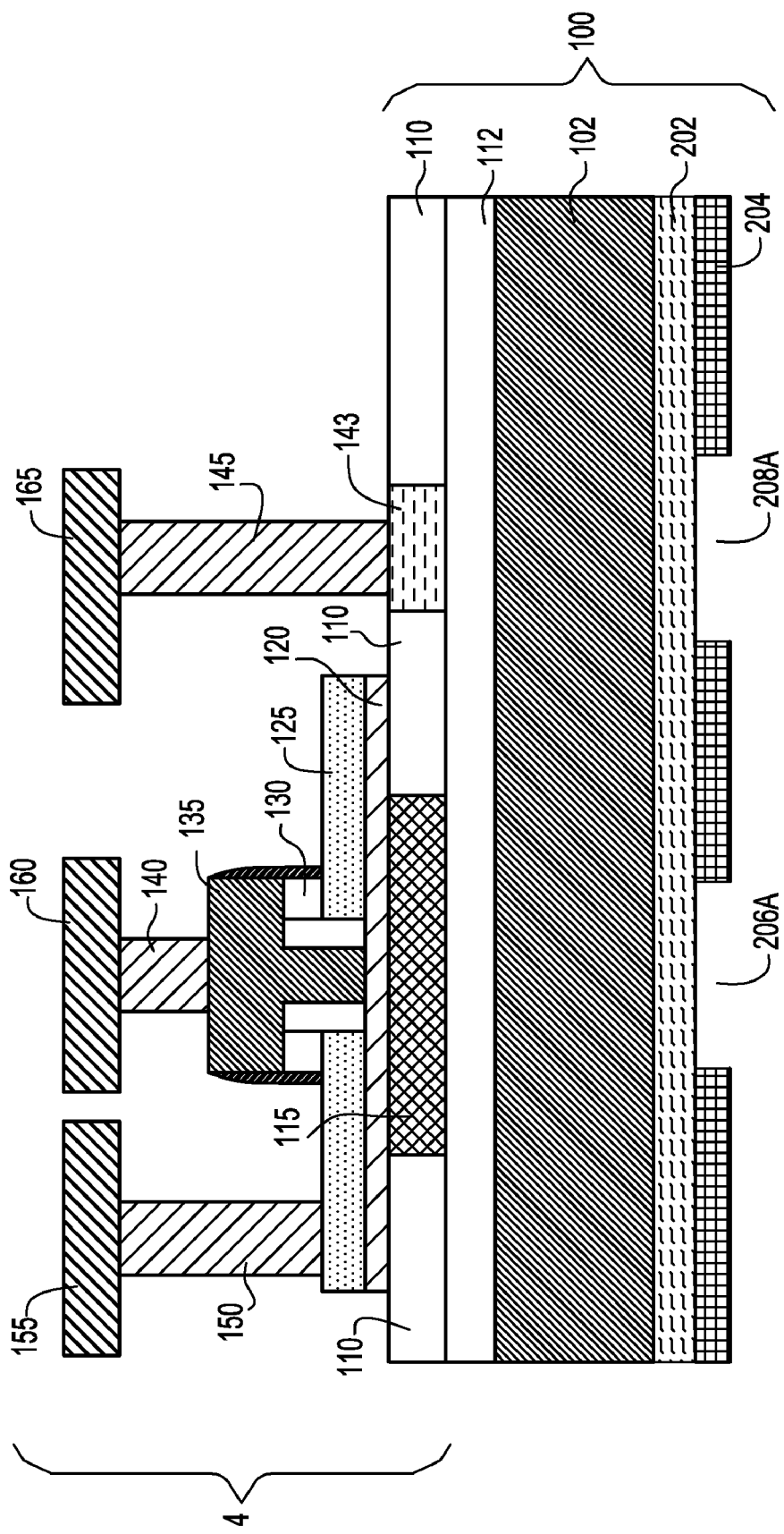

A dielectric hard mask layer 202 is then deposited over the entire backside of the thinned base semiconductor layer 102, followed by deposition of a patterned photoresist layer 204, as shown in FIG. 5. Preferably, but not necessarily, the dielectric hard mask layer 202 comprises silicon oxide. The dielectric hard mask layer 202 may be formed by any conventional deposition process, including, but not limited to: chemical vapor deposition (CVD), plasma-enhanced CVD, sputtering, evaporation, chemical solution deposition, and other like deposition processes. The patterned photoresist layer 204 is formed by first depositing a blanket photoresist layer (not shown) over the dielectric hard mask layer 202, exposing the blanket photoresist layer (not shown) to a desired pattern of radiation, and developing the exposed photoresist utilizing a conventional resist developer to form the contact openings 206A and 208A in the photoresist layer 204. The contact openings 206A and 208A must be respectively aligned with the collector 115 and the metal via contact 145 that are located at the front side of the substrate 100. Alignment marks can be provided on the mask levels that are used to form metal interconnects over the front side of the substrate 100, and an infrared-based technique can be used to detect the alignment marks on the front side of the substrate 100 for ensuring precise alignment of the contact openings 206A and 208A with the collector 115 and the metal via contact 145.

Figure 6:
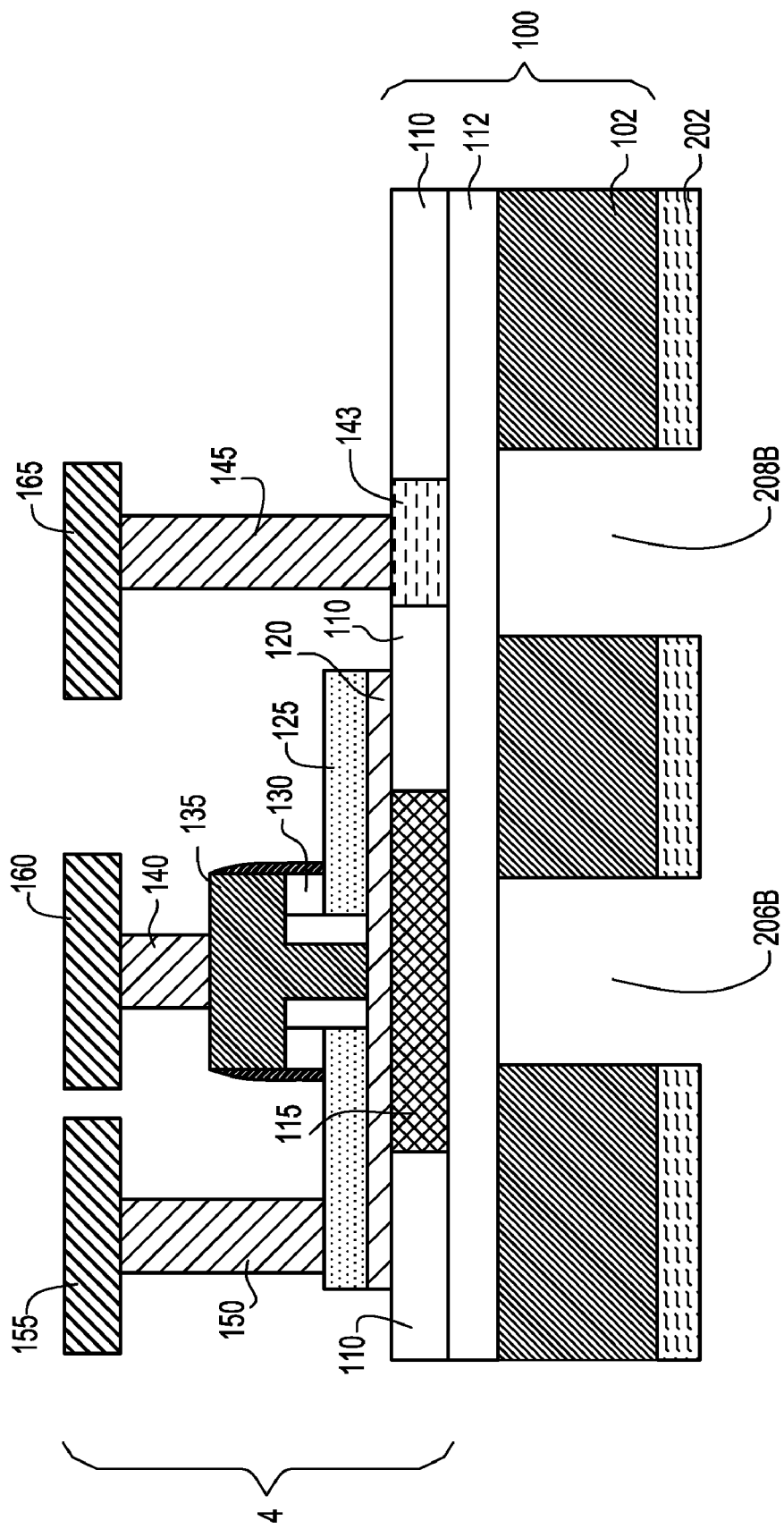

The pattern in the photoresist layer 204 is then transferred to the dielectric hard mask layer 202 and the base semiconductor substrate layer 102 by dry and/or wet etching steps, thereby forming contact openings 206B and 208B that extend through the dielectric hard mask layer 202 and the base semiconductor substrate layer 102, as shown in FIG. 6. Suitable dry etching processes that can be used in the present invention in patterning the blanket gate conductor layer (not shown) include, but are not limited to: reactive ion etching (RIE), ion beam etching, plasma etching or laser ablation. Suitable wet etching processes that can be used in the present invention for etching the base semiconductor substrate layer 102 include, but are not limited to: KOH-based etching chemistry or $SF_6$-based anistropic etching chemistry. The buried insulator layer 112 functions as an etch stop layer for the etching processes, and the patterned photoresist 204 is removed by resist stripping after etching has been completed.

Figure 7:
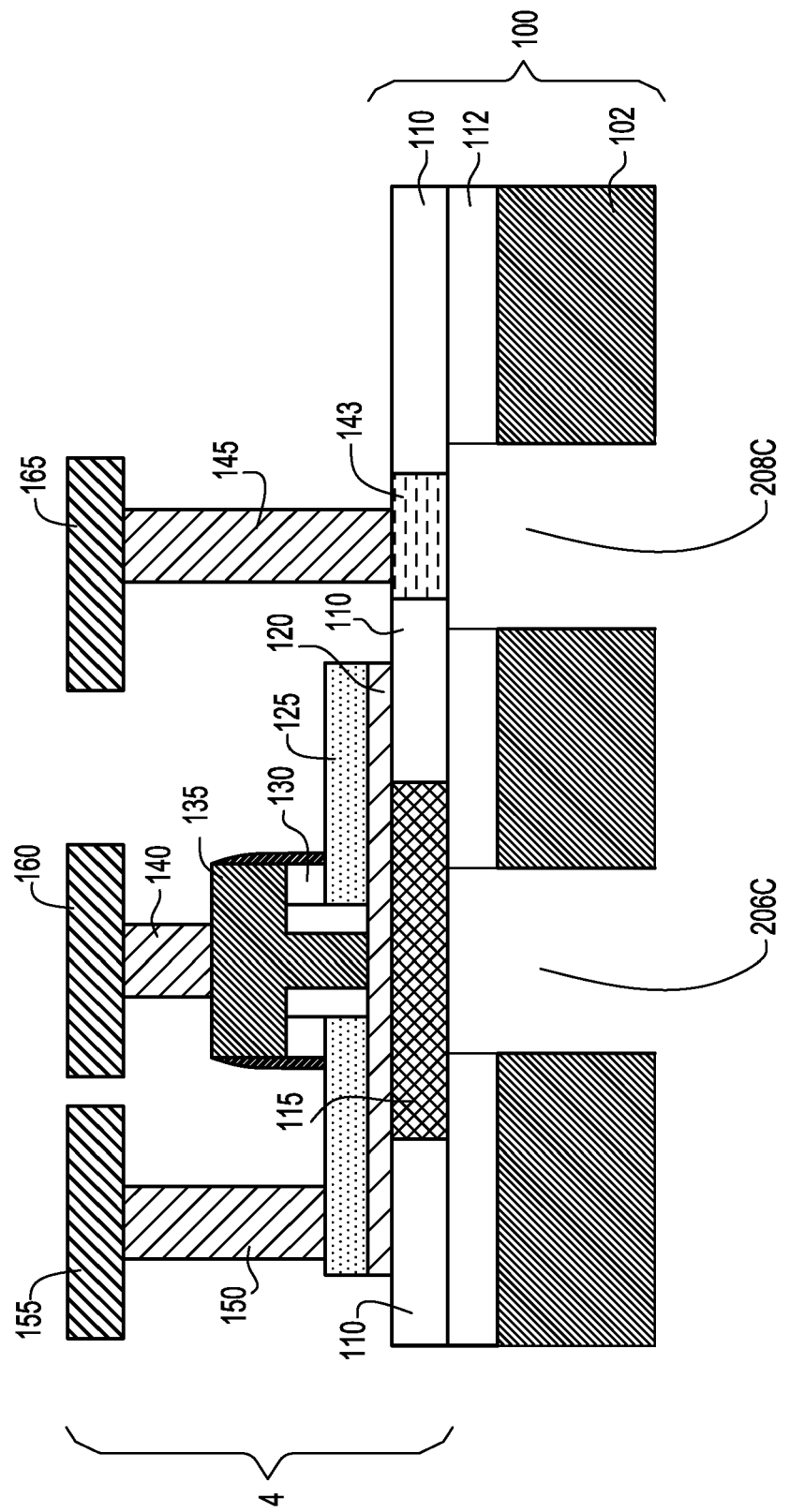

Subsequently, a dielectric etching step is carried out to open the buried insulator layer 112 and form contact openings 206C and 208C that also extend through the buried insulator layer 112, as shown in FIG. 7. Such a dielectric etching step also removes the dielectric hard mask layer 202. An HF-based etching chemistry can be used to carry out the dielectric etching step.

Figure 8:
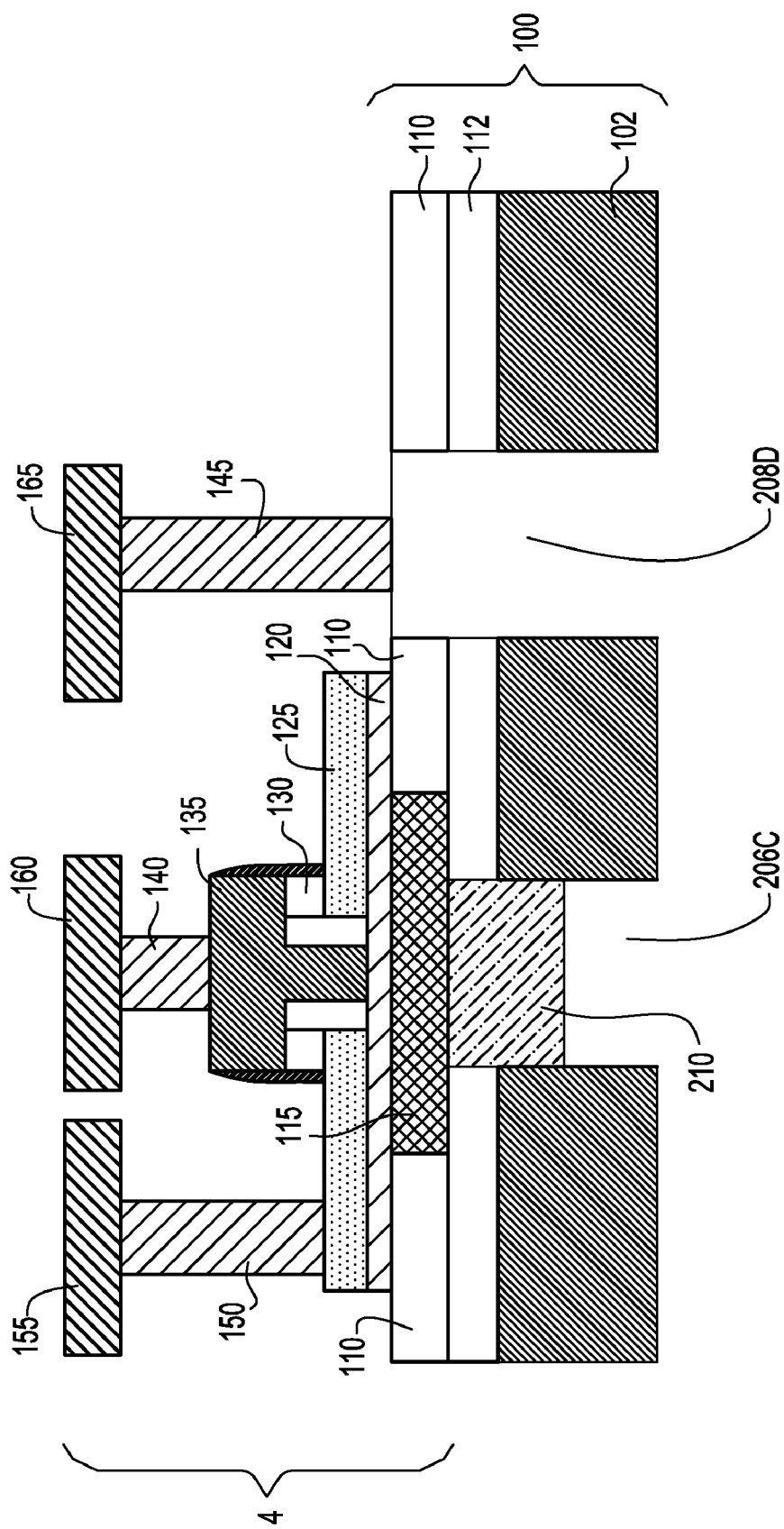

After formation of the contact openings 206C and 208C, a lithography step is carried out to selectively fill the contact opening 206C with a resist material 210 but expose the contact opening 208C, followed by another etching step to further extend the contact opening 208C, thereby forming a reach-through opening 208D that extends through the entire substrate 100 to reach the metal via contact 145 at the front side of the substrate 100, as shown in FIG. 8.

Next, a metal (not shown) is deposited over the entire structure by any suitable method known in the art, including, but not limited to: physical vapor deposition (PVD), CVD, electroplating, sputtering, etc. The term "metal" as used herein refers to any metal that is either in its elemental form or in a conductive compound form. Specifically, the term "metal" as used in the present invention includes pure metals, metal alloys, metal nitrides, metal silicides, etc. Preferred metals that can be used for practicing the present invention include aluminum, tungsten, copper, and their associated alloys, nitrides, and silicides.

The metal (not shown) so deposited fills the contact openings 206C and 208D and covers the backside of the base semiconductor substrate layer 102. Subsequently, a patterning process can be carried out to remove excess metal from the backside of the base semiconductor substrate layer 102, thereby forming the metal via contacts 215 and 225 in the substrate 100 and the patterned metal line contact 230 that extends across the back surface of the substrate 100 and connects the metal via contacts 215 and 225, as shown in FIG. 2.

Correspondingly, the metal via contacts 215 and 225 and the patterned metal line contact 230 form a conductive path that extends: (1) from the collector 115 through the substrate 100 to the back surface of the substrate 100, (2) across the back surface of the substrate 100, and (3) from the back surface of the substrate 100 to the metal via contact 145 on the front surface of the substrate 100.

Note that while FIG. 2 illustratively demonstrates an exemplary bipolar device, i.e., a HBT, which is formed in a substrate structure with backside metal contacts that extend through the substrate structure to connect the collector located in the substrate with the laterally offset collector contact located on the front surface of the substrate, according to specific embodiments of the present invention, it is clear that a person ordinarily skilled in the art can readily modify such an exemplary substrate and device structure for adaptation to specific application requirements, consistent with the above descriptions. For example, although the substrate structure as shown in FIG. 2 has a semiconductor-on-insulator (SOI) configuration, it is understood that a bulk semiconductor substrate structure may also be used for forming the improved bipolar device of the present invention. Further, the backside metal contacts of the present invention can be readily used for forming other bipolar semiconductor devices, such as other bipolar junction transistors, varactors, hyper-abrupt junction varactors, etc., besides the HBT shown in FIG. 2.

Figure 9:
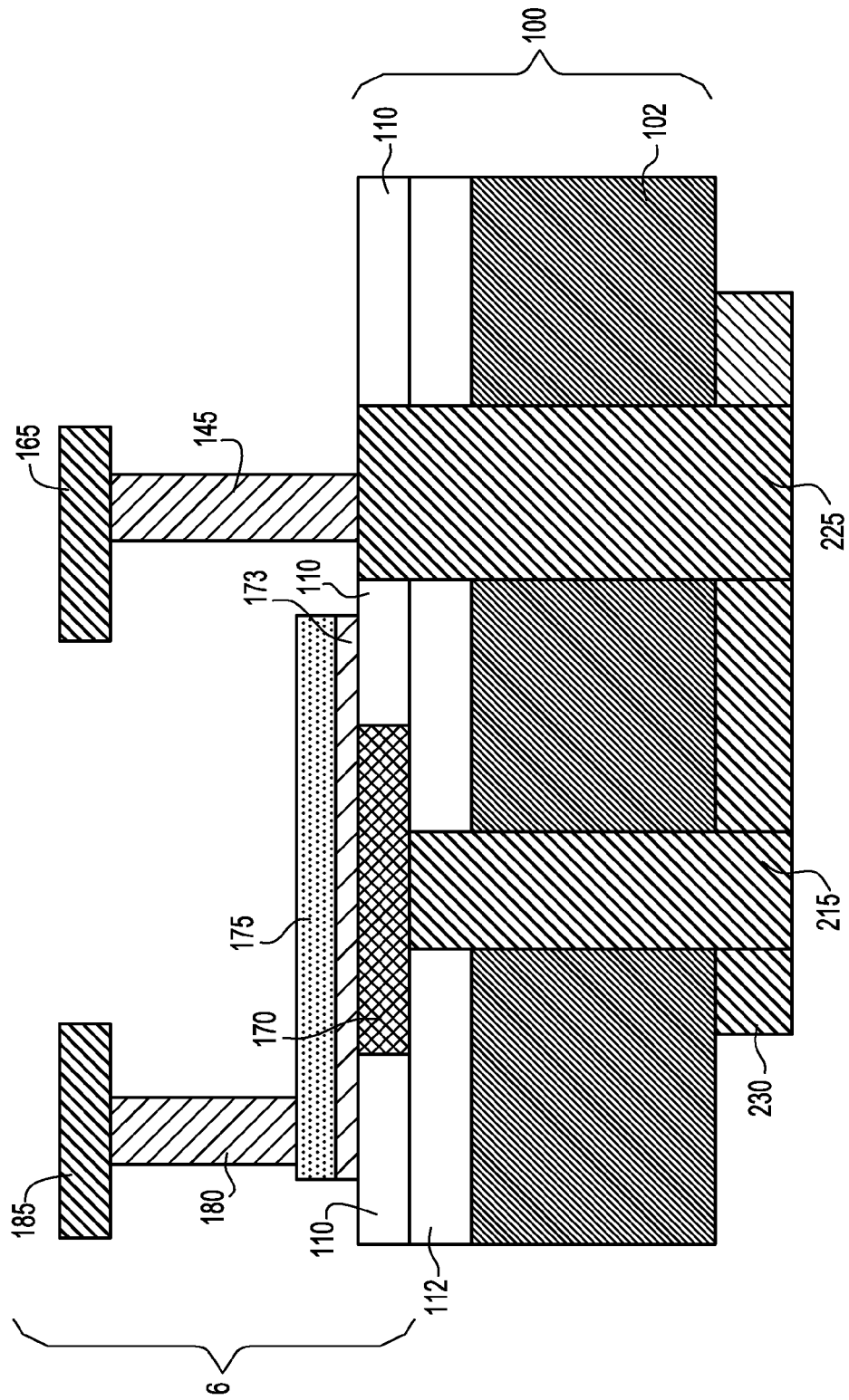
FIG. 9 show a cross-sectional view of an exemplary varactor that contains backside metal contacts for electrically connecting a cathode with a cathode metal contact that is located on the front surface of the substrate but is laterally offset from the cathode, according to one embodiment of the present invention.

For example, FIG. 9 shows a cross-sectional view of an exemplary varactor 6, which is preferably a hyper-abrupt junction varactor (HJV) that contains backside metal contacts for electrically connecting a cathode with a cathode metal contact that is located on the front surface of the substrate but is laterally offset from the cathode, according to one embodiment of the present invention.

Specifically, the HJV 6 is fabricated over the SOI substrate 100 as described hereinabove, and it comprises a cathode 170 that is located in an active region of the substrate structure 100 and an anode that comprises an intrinsic base layer 173 that is located over an upper surface of the substrate 100 and atop the cathode 170 and an extrinsic base layer 175 that is located over the intrinsic base layer 173. Preferably, the cathode 170 may contain a suitable n-type dopant species, the intrinsic base layer 173 may contain an n-type dopant species such as Sb, and the extrinsic base layer 175 may contain a suitable p-type dopant species.

For more details about the structure and fabrication process of HJV devices, please see U.S. Patent Application Publication No. 2005/0161769 published on Jul. 28, 2005 in the names of Coolbaugh et al., the content of which is incorporated by reference in its entirety for all purposes.

After formation of the cathode 170, an anode is deposited over the entire structure, and the anode includes an intrinsic base layer 173 and an extrinsic base layer 175. An interlevel dielectric (ILD) layer (not shown) is deposited, followed by formation of metal via contacts 145 and 180 through the ILD layer (not shown) over the front surface of the substrate structure 100. As it may be obvious to those in the art, the cathode could alternatively be formed after the anode. On one hand, the metal via contact 180 is laterally aligned with the extrinsic base layer 175 of the anode, and it thereby provides a direct electrical connection between anode electrode 185, which are located over the ILD layer (not shown), and the extrinsic base layer 175 of the anode, as shown in FIG. 9. On the other hand, the metal via contact 145 is laterally offset from the cathode 170 and therefore cannot provide direct electrical connection between cathode electrode 165 and the cathode 170. Instead, a conductive path, which preferably comprises a first metal via 215 that extends from the cathode 170 through the buried insulator layer 112 and the based semiconductor substrate layer 102 to the backside of the substrate structure 100, a metal line 230 that extends across the backside surface of the substrate structure 100, and a second metal via 225 that extends from the backside surface of the substrate structure 100 therethrough to contact the metal via contact 145 on the front surface of the substrate 100, is provided to electrically connect the cathode 170 with the cathode electrode 165.

The backside metal contacts 215, 225 and 230 as shown in FIG. 9 function conjunctively as a heat sink for reducing the junction temperature in the HJV device 6. They also function to reduce the parasitic resistance in the HJV device 6, thereby improving the device performance of such a device.

The HJV device as shown in FIG. 9 can be readily fabricated by similar processing steps that have been illustrated hereinabove in FIGS. 3-8.

While FIGS. 1-9 illustratively demonstrate exemplary device structures and processing steps that can be used to form such exemplary device structures, according to specific embodiments of the present invention, it is clear that a person ordinarily skilled in the art can readily modify the demonstrated device structures as well as the process steps for adaptation to specific application requirements, consistent with the above descriptions. It should therefore be recognized that the present invention is not limited to the specific embodiment illustrated hereinabove, but rather extends in utility to any other modification, variation, application, and embodiment, and accordingly all such other modifications, variations, applications, and embodiments are to be regarded as being within the spirit and scope of the invention.

What is claimed is:

1. A method for forming a device structure, comprising:
    forming a precursor structure that comprises: (a) a substrate that has a front surface and a back surface, (b) at least one bipolar junction transistor (BJT) that comprises at least a collector that is located in the substrate and a base that is located over and directly on the collector, and an emitter that is located over and directly on the base (c) a collector metal contact located over the front surface of the substrate and is laterally offset from, and not directly electrically connected to, the collector, and (d) a second conductive contact located over the front surface of the substrate that is electrically connected to the base; and
    forming a conductive metal path in said precursor structure to electrically connect the collector with the collector metal contact, wherein the conductive metal path extends: (1) from directly on the collector through the substrate to the back surface of the substrate, (2) across the back surface of the substrate, and (3) from the back surface of the substrate through the substrate to the collector metal contact on the front surface of the substrate.

2. The method of claim 1, wherein the conductive metal path is formed by:
    patterning the substrate to form first and second openings therein, wherein the first opening is laterally aligned with the collector and extends from the collector through the substrate to the back surface of the substrate, and wherein the second opening is laterally aligned with the collector metal contact and extends from the back surface of the substrate through the substrate to the collector metal contact on the front surface of the substrate;
    depositing a metal in the first and second openings and over the back surface of the substrate; and
    patterning the deposited metal to thereby form a metal line that extends: (1) from the collector through the substrate to the back surface of the substrate, (2) across the back surface of the substrate, and (3) from the back surface of the substrate through the substrate to the collector metal contact on the front surface of the substrate.

3. The method of claim 2, wherein the substrate is patterned by lithography and etching.

4. The method of claim 2, wherein the substrate comprises a semiconductor-on-insulator (SOI) substrate having a base semiconductor substrate layer, a buried insulator layer located over the base semiconductor substrate layer, and a semiconductor device layer located over the buried insulator layer, wherein an upper surface of the semiconductor device layer defines the front surface of the substrate, and wherein a lower surface of the base semiconductor substrate layer defines a back surface of the substrate.

5. The method of claim 2, wherein the collector has a first conductivity type, and wherein the base has a second, opposite conductivity type.

6. The method of claim 2, wherein the bipolar junction transistor (BJT) further comprises an emitter metal contact located over the front surface of the substrate that is electrically connected to the emitter.

* * * * *